US011187226B2

(12) United States Patent
Mou et al.

(10) Patent No.: US 11,187,226 B2
(45) Date of Patent: *Nov. 30, 2021

(54) ACTUATING-TYPE GAS GUIDING DEVICE

(71) Applicant: Microjet Technology Co., Ltd., Hsinchu (TW)

(72) Inventors: Hao-Jan Mou, Hsinchu (TW); Chi-Feng Huang, Hsinchu (TW); Yung-Lung Han, Hsinchu (TW); Chang-Yen Tsai, Hsinchu (TW); Wei-Ming Lee, Hsinchu (TW); Hsuan-Kai Chen, Hsinchu (TW)

(73) Assignee: MICROJET TECHNOLOGY CO., LTD., Hsinchu (TW)

( * ) Notice: Subject to any disclaimer, the term of this patent is extended or adjusted under 35 U.S.C. 154(b) by 701 days.

This patent is subject to a terminal disclaimer.

(21) Appl. No.: 16/051,767

(22) Filed: Aug. 1, 2018

(65) Prior Publication Data

US 2019/0067553 A1 Feb. 28, 2019

(30) Foreign Application Priority Data

Aug. 25, 2017 (TW) .................................. 106128914

(51) Int. Cl.
*H01L 41/04* (2006.01)
*F04B 45/047* (2006.01)
(Continued)

(52) U.S. Cl.
CPC ........ *F04B 45/047* (2013.01); *H01L 41/0471* (2013.01); *H01L 41/0477* (2013.01);
(Continued)

(58) Field of Classification Search
None
See application file for complete search history.

(56) References Cited

U.S. PATENT DOCUMENTS

2004/0108479 A1 6/2004 Garnier et al.
2010/0298895 A1* 11/2010 Ghaffari ................. A61N 5/062
607/3
(Continued)

FOREIGN PATENT DOCUMENTS

CN 102597519 A 7/2012
CN 103059257 A 4/2013
(Continued)

OTHER PUBLICATIONS

Author Unknown, "Magical new material," ISBN 978-7-5331-7044-8, Oct. 2013, pp. 207-208 (4 pages total).
(Continued)

*Primary Examiner* — Erica S Lin
(74) *Attorney, Agent, or Firm* — Birch, Stewart, Kolasch & Birch, LLP

(57) ABSTRACT

An actuating-type gas guiding device includes a main body and a piezoelectric actuator. The piezoelectric actuator is disposed in the main body. The piezoelectric actuator includes a suspension plate, an outer frame, at least one bracket and a piezoelectric element. The suspension plate has a first surface and a second surface. The suspension plate is permitted to undergo a bending vibration. The outer frame is arranged around the suspension plate. The at least one bracket is connected between the suspension plate and the outer frame for elastically supporting the suspension plate. The piezoelectric element is attached on the first surface of the suspension plate. In response to a voltage applied to the piezoelectric element, the suspension plate is driven to undergo the bending vibration in a reciprocating manner. Consequently, gas is guided to flow in the main body along a non-scattered linear direction.

9 Claims, 6 Drawing Sheets

(51) Int. Cl.
*H01L 41/047* (2006.01)
*H01L 41/053* (2006.01)
*H01L 41/083* (2006.01)
*F02M 51/06* (2006.01)

(52) U.S. Cl.
CPC ........ *H01L 41/053* (2013.01); *H01L 41/0838* (2013.01); *F02M 51/0603* (2013.01)

(56) References Cited

U.S. PATENT DOCUMENTS

| | | |
|---|---|---|
| 2013/0127299 A1 | 5/2013 | Kim et al. |
| 2016/0284978 A1 | 9/2016 | Aliane et al. |

FOREIGN PATENT DOCUMENTS

| | | | |
|---|---|---|---|
| CN | 104704644 A | | 6/2015 |
| CN | 106571423 A | | 4/2017 |
| CN | 107023459 A | * | 8/2017 |
| DE | 10 2014 113 888 A1 | | 8/2015 |
| EP | 3 203 074 A1 | | 8/2017 |
| JP | 2002-106470 A | | 4/2002 |
| KR | 10-2015-0032063 A | | 3/2015 |
| TW | M538545 U | | 3/2017 |
| TW | M545188 U | | 7/2017 |

OTHER PUBLICATIONS

Indian Office Action for Indian Application No. 201824029122, dated Feb. 27, 2020, with English translation.
Uchino, "Ferroelectric Devices," 2nd Edition, 2010, pp. 288-290 (5 pages total).
Extended European Search Report dated Dec. 7, 2018 for Application No. 18186764.9.
Song, "The New Viewpoint of Environment for Weapon System," Nov. 11, 2016, pp. 320-321 (5 pages total) with English abstract.
Wang, "Current status and development prospects of new materials industry," May 31, 2015, pp. 164-165 (5 pages total) with English abstract.

* cited by examiner

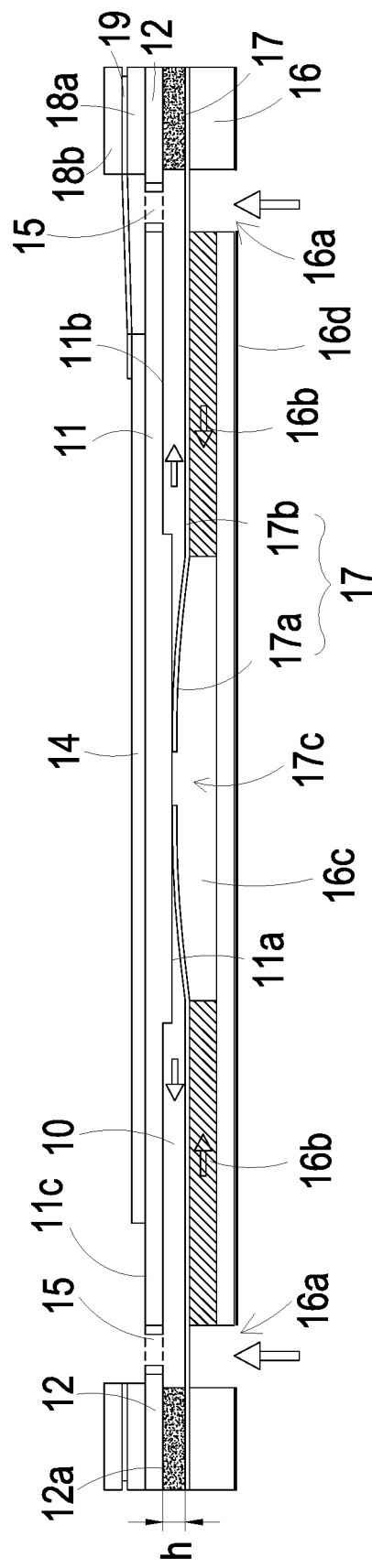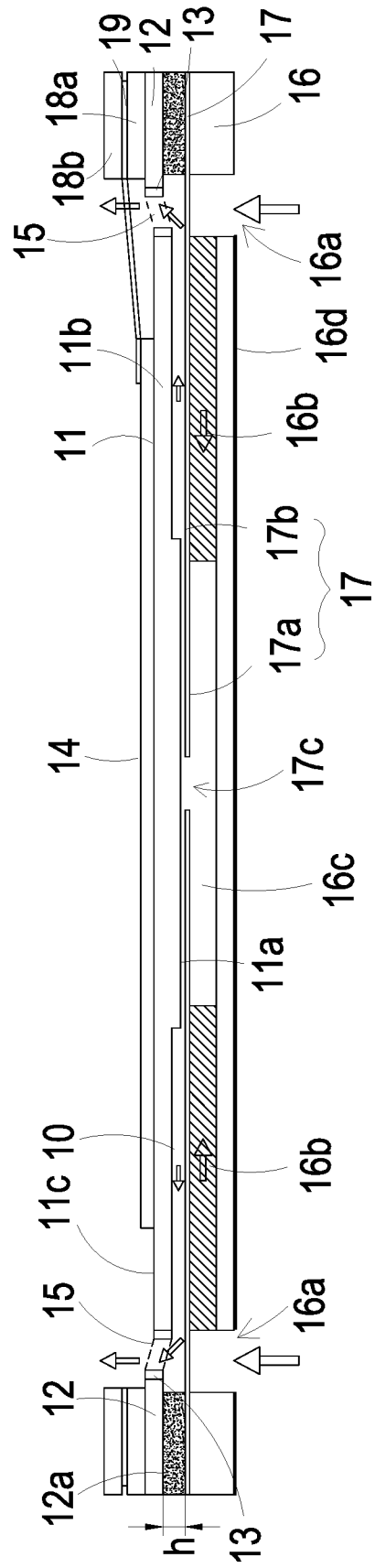
FIG. 5B
FIG. 5C

US 11,187,226 B2

ACTUATING-TYPE GAS GUIDING DEVICE

FIELD OF THE INVENTION

The present disclosure relates to an actuating-type gas guiding device, and more particularly to a miniature, slim and silent actuating-type gas guiding device.

BACKGROUND OF THE INVENTION

In various fields such as pharmaceutical industries, computer techniques, printing industries or energy industries, the products are developed toward elaboration and miniaturization. For example, actuating-type gas guiding devices are widely used in oven blowers, dental light curing machines, range hoods, sweepers, projector heat-dissipation devices, air blowers, dehumidifiers, vacuum cleaners, air cleaners, refrigerators, micro refrigerators, hair dryers, air conditioners, fans, portable ice fans, portable fans, heat-dissipation seat cushions, external heat dissipation modules of the mobile phones, external heat dissipation modules of notebook computers, heat dissipation modules of lamps, heat dissipation modules of engines, power supply devices, or the like. The actuating-type gas guiding device is used for driving the airflow to guide the airflow, dissipate the heat or circulate the gas. Since the above actuating-type gas guiding device has a conventional fan structure, it is difficult to reduce the overall volume of the actuating-type gas guiding device and the volume of the actuating-type gas guiding device is limited. In other words, it is difficult to minimize the actuating-type gas guiding device. Moreover, when the actuator of the conventional actuating-type gas guiding device is enabled, unpleasant noise is generated and the heat-dissipating efficiency is impaired. That is, the conventional actuating-type gas guiding device is neither friendly nor comfortable to the user.

For overcoming the drawbacks of the conventional technologies, it is important to provide a small, miniature and silent actuating-type gas guiding device with enhanced heat-dissipating efficacy and increased comfortable benefits.

SUMMARY OF THE INVENTION

An object of the present disclosure provides an actuating-type gas guiding device. The actuating-type gas guiding device includes a piezoelectric actuator. When a piezoelectric element of the piezoelectric actuator is operated at a high frequency, a pressure gradient is generated to facilitate the gas to flow at a high speed along the non-scattered linear direction. At the same time, the gas can be transferred silently, and the overall volume of the actuating-type gas guiding device is reduced and thinned. Therefore, the issues of having larger volume, thinning hardly and generating unpleasant noise encountered by the prior art are overcome.

In accordance with an aspect of the present disclosure, an actuating-type gas guiding device is provided. The actuating-type gas guiding device includes a main body and at least one piezoelectric actuator. The at least one piezoelectric actuator is disposed in the main body. The piezoelectric actuator includes a suspension plate, an outer frame, at least one bracket and a piezoelectric element. The suspension plate has a first surface and a second surface. The suspension plate is permitted to undergo a bending vibration. The outer frame is arranged around the suspension plate. The at least one bracket is connected between the suspension plate and the outer frame for elastically supporting the suspension plate. The piezoelectric element is attached on the first surface of the suspension plate. In response to a voltage applied to the piezoelectric element, the suspension plate is driven to undergo the bending vibration in a reciprocating manner Consequently, gas is guided to flow in the main body along a non-scattered linear direction.

The above contents of the present disclosure will become more readily apparent to those ordinarily skilled in the art after reviewing the following detailed description and accompanying drawings, in which:

BRIEF DESCRIPTION OF THE DRAWINGS

FIGS. 5A to 5E schematically illustrate the actions of the piezoelectric actuator as shown in FIG. 4.

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
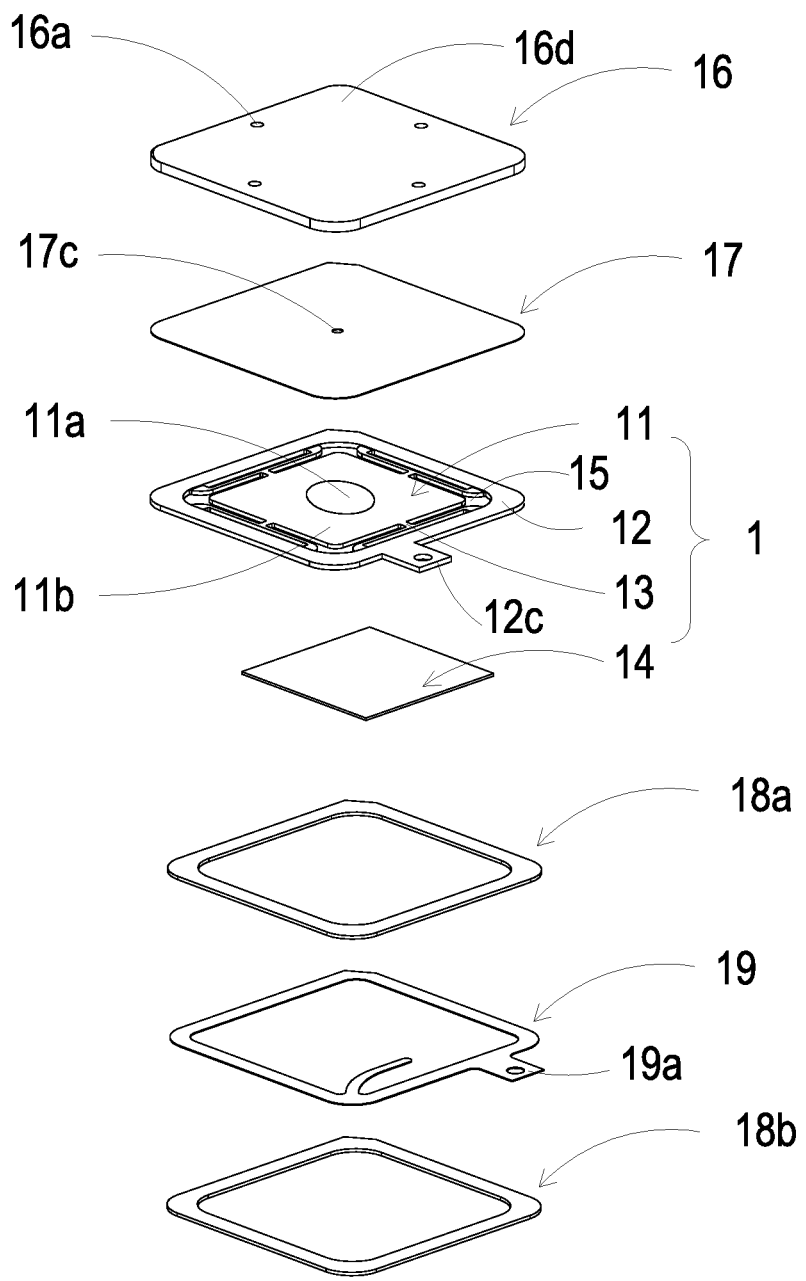
FIG. 1 is a schematic exploded view illustrating a piezoelectric actuator of an actuating-type gas guiding device according to an embodiment of the present disclosure and taken along a front side.
Figure 2:
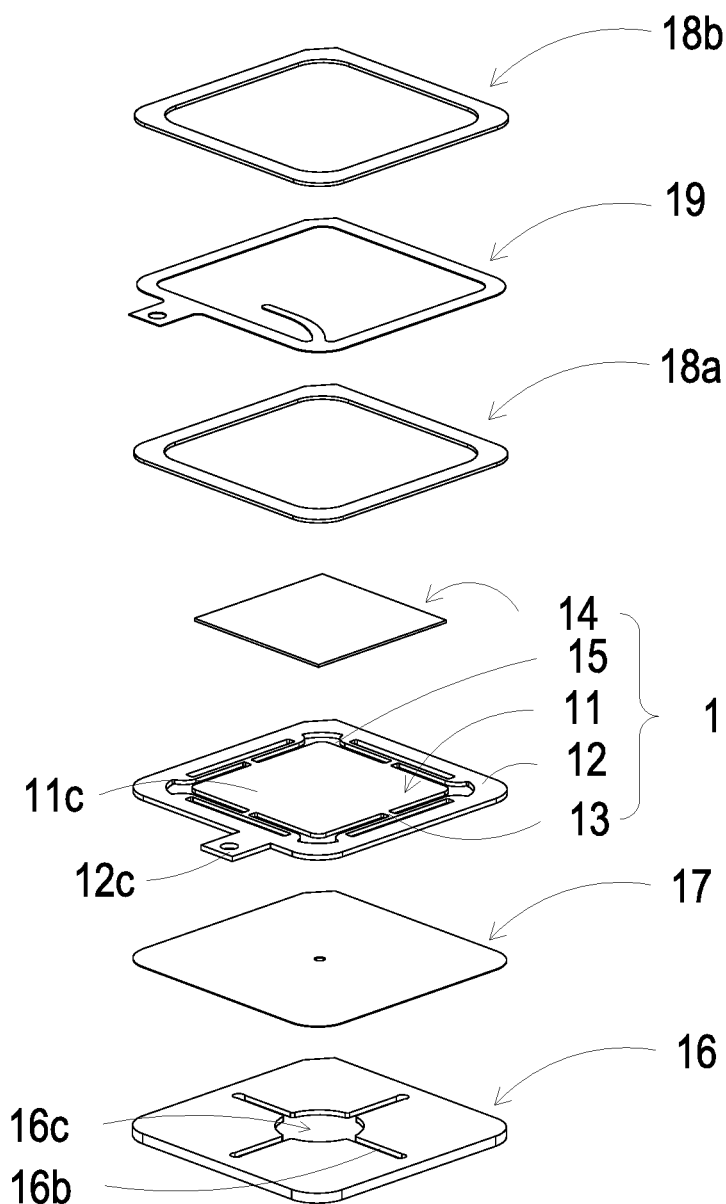
FIG. 2 is a schematic exploded view illustrating the piezoelectric actuator of the actuating-type gas guiding device according to the embodiment of the present disclosure and taken along a rear side.
Figure 3:
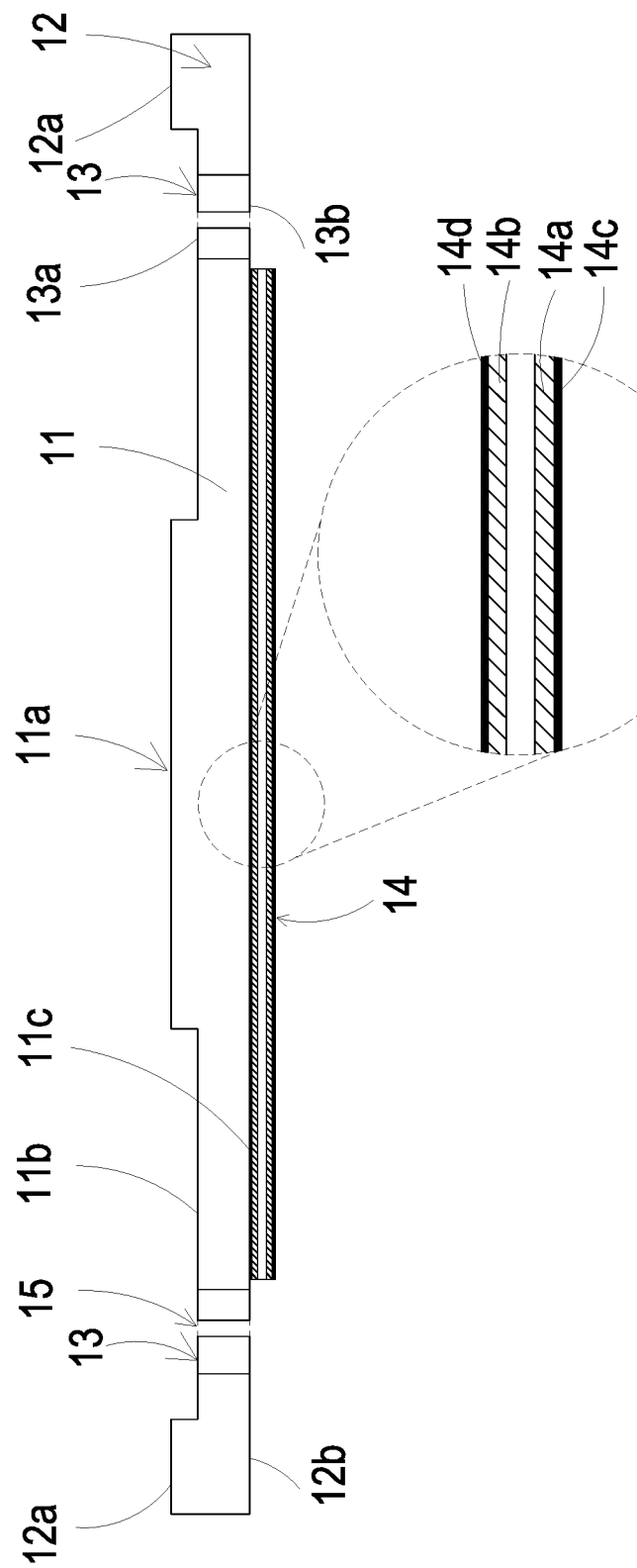
FIG. 3 is a schematic cross-sectional view illustrating the relationship between the suspension plate, the outer frame, the bracket and the piezoelectric element of the piezoelectric actuator of the actuating-type gas guiding device according to the embodiment of the present disclosure.

Please refer to FIGS. 1 to 3. The present discourse provides an actuating-type gas guiding device including at least one main body (not shown), at last one piezoelectric actuator 1, at least one suspension plate 11, at least one outer frame 12, at least one bracket 13 and at least one piezoelectric element 14. The number of the main body, the suspension plate 11, the outer frame 12 and the piezoelectric element 14 is exemplified by one for each in the following embodiments but not limited thereto. It is noted that each of the main body, the suspension plate 11, the outer frame 12 and the piezoelectric element 14 can also be provided in plural numbers.

Figure 4:
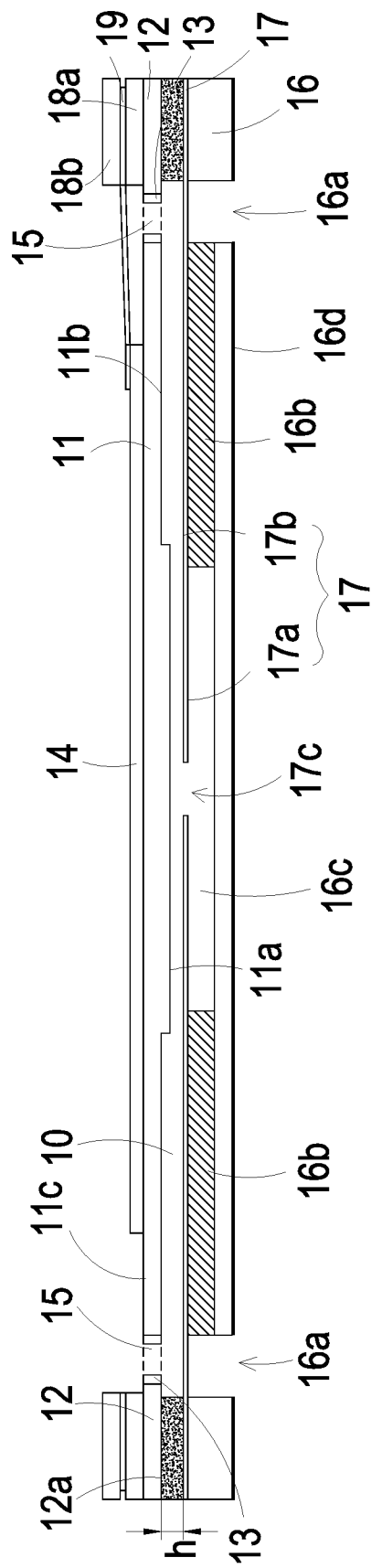
FIG. 4 is a schematic cross-sectional view illustrating the piezoelectric actuator of the actuating-type gas guiding device according to the embodiment of the present disclosure.

Please refer to FIGS. 1, 2 and 4. The actuating-type gas guiding device includes a main body (not shown) and at least one piezoelectric actuator 1. An example of the main body includes but is not limited to an oven blower, a dental light curing machine, a range hood, a sweeper, a projector heat-dissipation device, an air blower, a dehumidifier, a vacuum cleaner, an air cleaner, a refrigerator, a micro refrigerator, a hair dryer, an air conditioner, a fan, a portable ice fan, a portable fan, a heat-dissipation seat cushion, an external heat dissipation module of the mobile phone, an external heat dissipation module of a notebook computer, a heat dissipation module of a lamp, a heat dissipation module of an engine or a power supply device. The at last one piezoelectric actuator 1 is disposed in the main body. When the piezoelectric actuator 1 is enabled, gas is guided to flow in the main body along a non-scattered linear direction. In addition, the purpose of transferring the gas is achieved according to the requirements of the main body. In case that a great deal of gas to be guided is required, the number of the piezoelectric actuator 1 in the main body is increased. If plural piezoelectric actuators 1 are disposed in the main body, the plural piezoelectric actuators 1 are connected with each other in series or in parallel. Since the overall area of the piezoelectric actuators 1 is increased, a great deal of gas can be guided and transferred.

In this embodiment, the piezoelectric actuator 1 is disposed in the main body and includes a suspension plate 11, an outer frame 12, at least one bracket 13 and a piezoelectric element 14. The suspension plate 11 has a first surface 11c and a second surface 11b. Moreover, the suspension plate 11 can be subjected to bending vibration. The outer frame 12 is arranged around outside of the suspension plate 11. The at least one bracket 13 is connected between the suspension plate 11 and the outer frame 12, while the two ends of the bracket 13 are connected with the outer frame 12 and the suspension plate 11 respectively that the bracket 13 can elastically support the suspension plate 11. At least one vacant space 15 is formed between the bracket 13, the suspension plate 11 and the outer frame 12. The gas is allowed to flow through the at least one vacant space 15. The type and the number of the suspension plate 11, the outer frame 12 and the at least one bracket 13 are not limited and may be varied according to the practical requirements. The outer frame 12 is arranged around outside of the suspension plate 11. Moreover, a conducting pin 12c is protruded outwardly from the outer frame 12 so as to be electrically connected with an external circuit (not shown), but not limited thereto.

As shown in FIG. 3, the suspension plate 11 of this embodiment is a stepped structure. Namely, the second surface 11b of the suspension plate 11 is further included a bulge 11a. The bulge 11a may be a circular convex structure. The bulge 11a of the suspension plate 11 is coplanar with a second surface 12a of the outer frame 12, while the second surface 11b of the suspension plate 11 is coplanar with a second surface 13a of the bracket 13. Moreover, there is a specific depth from the bulge 11a of the suspension plate 11 (or the second surface 12a of the outer frame 12) to the second surface 11b of the suspension plate 11 (or the second surface 13a of the bracket 13). A first surface 11c of the suspension plate 11, a first surface 12b of the outer frame 12 and a first surface 13b of the bracket 13 are coplanar with each other.

The piezoelectric element 14 is attached on the flat first surface 11c of the suspension plate 11. In some other embodiments, the suspension plate 11 may be a square plate structure with two flat surfaces, but the structure of the suspension plate 11 may be varied according to the practical requirements. In this embodiment, the suspension plate 11, the bracket 13 and the outer frame 12 are integrally formed from a metal plate (e.g., a stainless steel plate). In an embodiment, the length of a side of the piezoelectric element 14 is smaller than the length of a side of the suspension plate 11. In another embodiment, the length of a side of the piezoelectric element 14 is equal to the length of a side of the suspension plate 11. Similarly, the piezoelectric element 14 is a square plate structure corresponding to the suspension plate 11 in terms of the design. In an embodiment, the piezoelectric element 14 is made of a mixture comprising a highly-piezoelectric material and graphene. For example, the highly-piezoelectric material is lead zirconate titanate (PZT) piezoelectric powder. The percentage of the graphene is in the range between 0.1% and 20%. Due to the excellent piezoelectric property of lead zirconate titanate, the suspension plate 11 has good piezoelectric driving efficacy. Moreover, the piezoelectric element 14 comprises two electrodes 14a and 14b. Each of the electrodes 14a and 14b is made of a mixture comprising silver-palladium alloy and graphene. Consequently, the impedance is reduced, the charge moving speed is increased, and the thermal conductivity is increased to facilitate heat dissipation. Moreover, the surface of the electrode 14a is coated with a thermal conduction layer 14c, wherein thermal conduction layer 14c is a synthesized paint that is doped with graphene. The thermal conduction layer 14c is used for increasing the thermal conductivity, so that the heat dissipation efficiency is enhanced. The electrode 14b is coated with an adhesive layer 14d. The adhesive layer 14d is an epoxy resin adhesive layer with doped graphene. Through the adhesive layer 14d, the piezoelectric element 14 is attached on the first surface 11c of the suspension plate 11. Similarly, the use of the adhesive layer 14d reduces the impedance, increases the charge moving speed and increases the thermal conductivity, and thus the heat dissipation efficacy is enhanced. When a voltage is applied to the two electrodes 14a and 14b, the piezoelectric element 14 is subjected to the bending deformation and the suspension plate 11 is subjected to a bending vibration in a reciprocating manner.

Please refer to FIGS. 1 and 2 again. The actuating-type gas guiding device further includes a gas inlet plate 16, a resonance plate 17, a first insulation plate 18a, a conducting plate 19 and a second insulation plate 18b. The suspension plate 11 is aligned with the resonance plate 17. The gas inlet plate 16, the resonance plate 17, the outer frame 12, the first insulation plate 18a, the conducting plate 19 and the second insulation plate 18b are stacked on each other sequentially. After the above components are combined together, the cross-sectional view of the resulting structure of the actuating-type gas guiding device is shown in FIG. 4.

Please refer to FIGS. 1 and 2. As shown in FIG. 1, the gas inlet plate 16 is arranged beside the second surface 11b of the suspension plate 11, and the gas inlet plate 16 includes at least one inlet 16a. Preferably but not exclusively, the gas inlet plate 16 includes four inlets 16a. The inlets 16a run through the gas inlet plate 16. In response to the action of the atmospheric pressure, the gas outside the device can be introduced into the gas inlet plate 16 through the at least one inlet 16a. As shown in FIG. 2, the gas inlet plate 16 includes at least one convergence channel 16b in communication with the at least one inlet 16a of the gas inlet plate 16. Moreover, a central cavity 16c is located at the central intersection of the convergence channels 16b. The central cavity 16c is in communication with the at least one convergence channel 16b. A first surface 16d of the gas inlet plate 16 is coated with a synthesized paint that is doped with graphene. The first surface 16d is used to increase the thermal conductivity for enhancing the heat dissipation efficiency. Owing to the at least one convergence channel 16b corresponding to the at least one inlet 16a formed in the first surface 16d of the gas inlet plate 16, the gas is guided to the central cavity 16c, wherein the gas is introduced into the at least one convergence channel 16b through the at least one inlet 16a. Consequently, the gas can be transferred by the piezoelectric actuator 1. In this embodiment, the at least one inlet 16a, the at least one convergence channel 16b and the central cavity 16c of the gas inlet plate 16 are integrally formed from a single structure. The central cavity 16c forms a convergence chamber for temporarily storing the gas. In some embodiments, the gas inlet plate 16 may be, for example, made of stainless steel. Moreover, the depth of the convergence chamber defined by the central cavity 16c may be equal to the depth of the at least one convergence channel 16b. The resonance plate 17 may be made of flexible material. The resonance plate 17 is disposed between the gas inlet plate 16 and the suspension plate 11, and the resonance plate 17 has a central aperture 17c aligned with the central cavity 16c of the gas inlet plate 16 which allows the gas to be transferred therethrough. In other embodiments, the resonance plate 17 may be, for example, made of copper.

In this embodiment, the first insulation plate 18a, the conducting plate 19 and the second insulation plate 18b are stacked on each other sequentially and located under the outer frame 12, as shown in FIG. 3A. The profiles of the first insulation plate 18a, the conducting plate 19 and the second insulation plate 18b substantially match the profile of the outer frame 12. In some embodiments, the first insulation plate 18a and the second insulation plate 18b may be made of an insulating material (e.g. a plastic material) for providing insulating efficacy. In other embodiments, the conducting plate 19 may be made of an electrically conductive material (e.g. a metallic material) for providing electrically conducting efficacy. In this embodiment, the conducting plate 19 may have a conducting pin 19a disposed thereon so as to be electrically connected with an external circuit (not shown). The conducting pin 12c of the outer frame 12 is electrically connected to the electrode 14a of the piezoelectric element 14. The conducting pin 19a of the conducting plate 19 is electrically connected to the electrode 14b of the piezoelectric element 14.

Please refer to FIG. 4. In an embodiment, the gas inlet plate 16, the resonance plate 17, the outer frame 12, the first insulation plate 18a, the conducting plate 19 and the second insulation plate 18b are stacked on each other sequentially. Consequently, the gas is allowed to flow through the actuating-type gas guiding device. Moreover, there is a gap h between the resonance plate 17 and the outer frame 12. In this embodiment, the gap h between the resonance plate 17 and the outer frame 12 may be filled with a filler (e.g. a conductive adhesive) so that a depth from the resonance plate 17 to the bulge 11a of the suspension plate 11 can be maintained. The gap h ensures the proper distance between the resonance plate 17 and the bulge 11a of the suspension plate 11, so that the gas can be transferred quickly, the contact interference is reduced and the generated noise is largely reduced. In some embodiments, alternatively, the height of the outer frame 12 of the piezoelectric actuator 1 is increased, so that a gap is formed between the resonance plate 17 and the outer frame 12.

Please refer to FIG. 1, FIG. 2 and FIG. 4. After the gas inlet plate 16, the resonance plate 17 and the outer frame 12 are combined together, a movable part 17a and a fixed part 17b of the resonance plate 17 are defined. The movable part 17a is around the central aperture 17c. A convergence chamber for converging the gas is defined by the movable part 17a of the resonance plate 17 and the gas inlet plate 16 collaboratively. Moreover, a first chamber 10 is formed between the resonance plate 17, the suspension plate 11, the brackets 13 and the outer frame 12 for temporarily storing the gas. Through the central aperture 17c of the resonance plate 17, the first chamber 10 is in communication with the convergence chamber of the central cavity 16c of the gas inlet plate 16. The peripheral regions of the first chamber 10 are in communication with the gas channel through the vacant space 15 between the brackets 13.

Figure 5A:
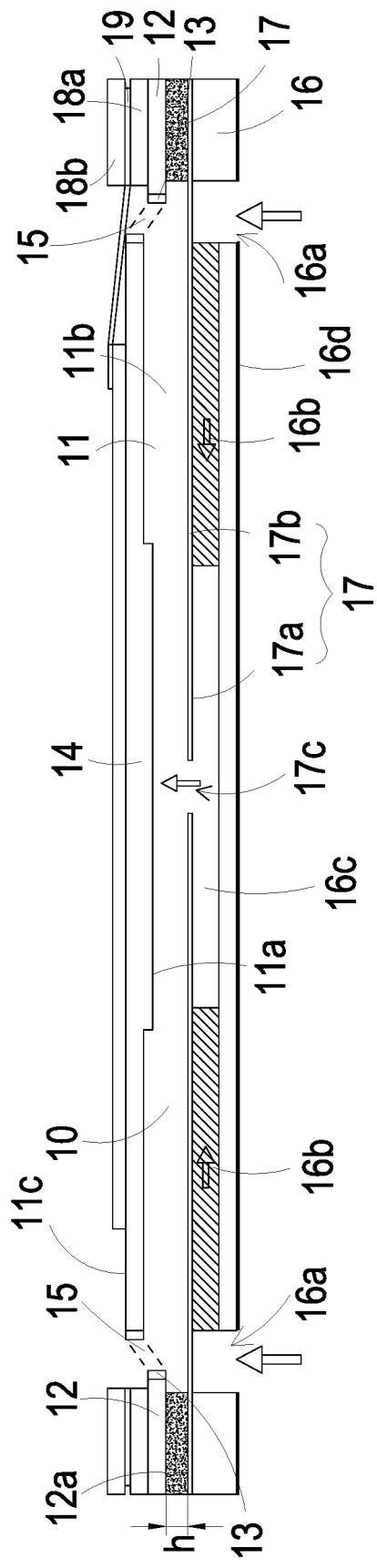
Figure 5D:
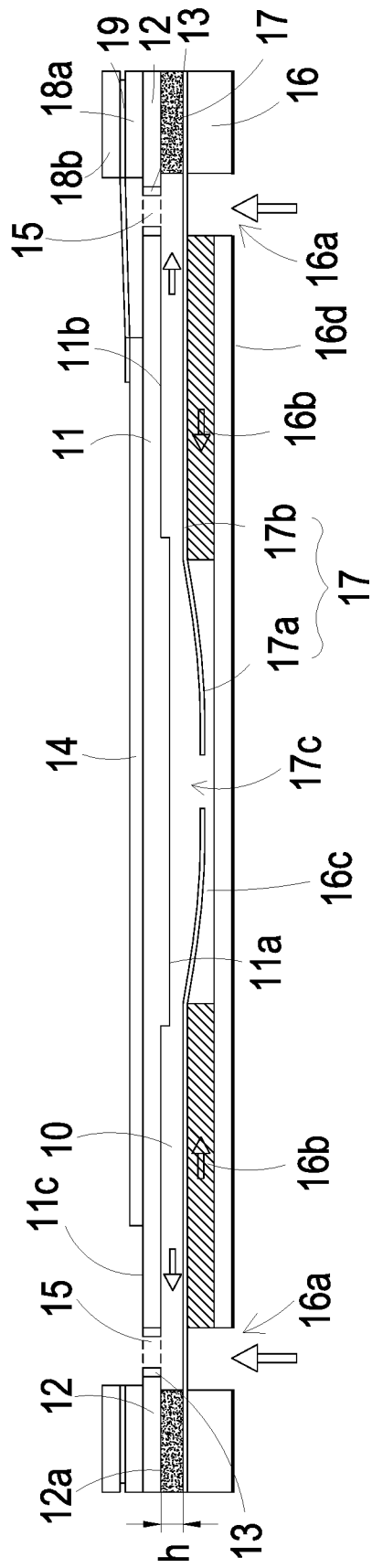
Figure 5E:
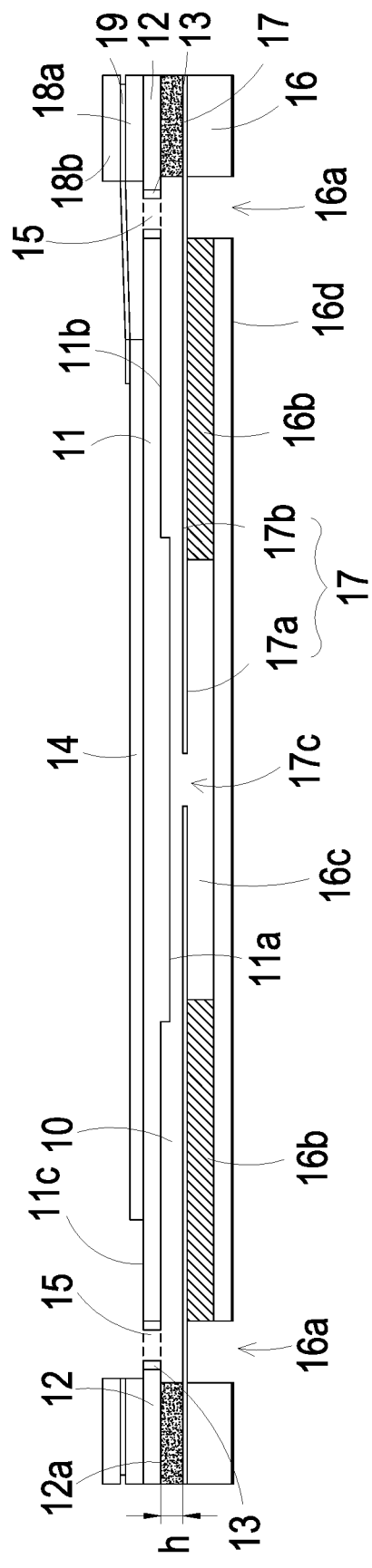

Please refer to FIG. 1, FIG. 2, FIG. 4 and FIGS. 5A to 5E. When the piezoelectric actuator 1 is enabled, the piezoelectric element 14 vibrates along a vertical direction in a reciprocating manner by using the bracket 13 as a fulcrum. Please refer to FIG. 5A, the piezoelectric element 14 vibrates along a first direction in response to the applied voltage. Since the resonance plate 17 is light and thin, the resonance plate 17 vibrates along the vertical direction in the reciprocating manner in resonance with the piezoelectric element 14. More especially, a region of the resonance plate 17 spatially corresponding to the central cavity 16c of the gas inlet plate 16 is also subjected to a bending deformation. The region of the resonance plate 17 corresponding to the central cavity 16c of the gas inlet plate 16 is the movable part 17a of the resonance plate 17. When the piezoelectric element 14 vibrates along the first direction, the movable part 17a of the resonance plate 17 corresponding to the central cavity 16c is subjected to the bending deformation because the movable part 17a of the resonance plate 17 is pushed by the gas and vibrated in response to the piezoelectric element 14. In response to the vibration of the piezoelectric element 14 along the first direction, the gas is fed into the at least one inlet 16a of the gas inlet plate 16. Then, the gas is transferred to the central cavity 16c of the gas inlet plate 16 through the at least one convergence channel 16b. Then, the gas is transferred through the central aperture 17c of the resonance plate 17 spatially corresponding to the central cavity 16c, and introduced into the first chamber 10 along the first direction. As the piezoelectric element 14 is enabled, the resonance of the resonance plate 17 occurs. Consequently, the resonance plate 17 vibrates along the vertical direction in the reciprocating manner. As shown in FIG. 5B, during the vibration of the movable part 17a of the resonance plate 17, the movable part 17a moves along the first direction to contact and attach on the bulge 11a of the suspension plate 11, and a distance of the convergence chamber from the fixed part 17b of the resonance plate 17 to a region of the suspension plate 11 except the bulge 11a remains the same. Owing to the deformation of the resonance plate 17 described above, a middle communication space of the first chamber 10 is closed, and the volume of the first chamber 10 is compressed. Under this circumstance, the gas is pushed moving toward peripheral regions of the first chamber 10, and flowing along the first direction through the vacant space 15 between the brackets 13. As shown in FIG. 5C, the movable part 17a of the resonance plate 17 returns to its original position when the movable part 17a vibrates along a second direction. While the piezoelectric element 14 vibrates along the second direction in response to an applied voltage, the volume of the first chamber 10 is compressed, which makes the gas in the first chamber 10 continuously pushed toward peripheral regions. Meanwhile, the gas is continuously fed into the at least one inlet 16a of the gas inlet plate 16, and transferred to the convergence chamber of the central cavity 16c. Then, as shown in FIG. 5D, the resonance plate 17 moves along the second direction, which is cause by the resonance of the suspension plate 11. That is, the movable part 17a of the resonance plate 17 also vibrates along the second direction. Consequently, it decreases the current of the gas from the at least one inlet 16a of the gas inlet plate 16 into the convergence chamber formed by the central cavity 16c. At last, as shown in FIG. 5E, the movable part 17a of the resonance plate 17 has returned to its original position. As the embodiments described above, when the resonance plate 17 vibrates along the vertical direction in the reciprocating manner, the gap h between the resonance plate 17 and the outer frame 12 is helpful to increase maximum displacement along the vertical direction during the vibration. In other words, the configuration of the gap h between the resonance plate 17 and the outer frame 12 can increase the amplitude of up and down displacement of the resonance plate 17 during the vibration. Consequently, a pressure gradient is generated in the gas channels of the piezoelectric actuator 1 to facilitate the gas to flow at a high speed. Moreover, since there is an impedance difference between the feeding direction and the exiting direction, the gas can be transmitted from the inlet side to the outlet side. Even if a gas pressure exists at the outlet side, the piezoelectric actuator 1 still has the capability of pushing the gas to the gas channel while achieving the silent efficacy. The steps of FIGS. 5A to 5E may be done repeatedly. Consequently, the gas circulation is generated in which the ambient gas is transferred from the outside to the inside by the piezoelectric actuator 1. Moreover, the gas is transferred along a non-scattered linear direction.

It is noted that numerous modifications and alterations may be made while retaining the teachings of the disclosure. For example, in some embodiments, the actuating-type gas guiding device further includes a sensor (not shown). The sensor is disposed adjacent to the piezoelectric actuator 1. When the piezoelectric actuator 1 is enabled, gas is guided to flow along a non-scattered linear direction and flow toward the sensor, so that the gas guided along the non-scattered linear direction is sensed by the sensor to generate an output data. The piezoelectric actuator 1 is used to guide airflow and provide the amount of air stably and uniformly. Since the sensor is provided with the amount of the air stably and uniformly, the response time of the sensor to the air is largely reduced and the air is monitored with precision. Moreover, the sensor transmits the output data to a connection device (not shown). The information carried in the output data is displayed, stored and transmitted by the connection device. For example, the information carried in the output data contains the temperature, the flowrate, or the like.

From the above descriptions, the present disclosure provides an actuating-type gas guiding device. The actuating-type gas guiding device includes a piezoelectric actuator. When a piezoelectric element of the piezoelectric actuator is operated at a high frequency, a pressure gradient is generated to facilitate the gas to flow at a high speed along the non-scattered linear direction. Consequently, the gas can be transferred quickly and silently. Moreover, the actuating-type gas guiding device is small and slim. In other words, the actuating-type gas guiding device of the present disclosure is industrially valuable.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An actuating-type gas guiding device, comprising:
    a main body; and
    at least one piezoelectric actuator disposed in the main body, wherein the piezoelectric actuator comprises:
        a suspension plate having a first surface and a second surface, wherein the suspension plate is permitted to undergo a bending vibration;
        an outer frame arranged around the suspension plate;
        at least one bracket connected between the suspension plate and the outer frame for elastically supporting the suspension plate; and
        a piezoelectric element attached on the first surface of the suspension plate, wherein in response to a voltage applied to the piezoelectric element, the suspension plate is driven to undergo the bending vibration in a reciprocating manner, so that gas is guided to flow in the main body along a non-scattered linear direction, wherein the piezoelectric element is made of a mixture comprising lead zirconate titanate piezoelectric powder and graphene, wherein a weight percentage of the graphene is in a range between 0.1% and 20%.

2. The actuating-type gas guiding device according to claim 1, wherein the piezoelectric element comprises a first electrode and a second electrode, and each of the first electrode and the second electrode is made of a mixture comprising silver-palladium alloy and graphene, wherein a surface of the first electrode is coated with a thermal conduction layer that is made of a synthesized paint with doped graphene, a surface of the second electrode is coated with an adhesive layer that is made of epoxy resin adhesive with doped graphene, and the piezoelectric element is attached on the first surface of the suspension plate through the adhesive layer, wherein in response to the voltage applied to the first electrode and the second electrode, the suspension plate is driven to undergo the bending vibration.

3. The actuating-type gas guiding device according to claim 1, further comprising:
    a gas inlet plate arranged beside the second surface of the suspension plate, and having at least one inlet, at least one convergence channel and a central cavity defining a convergence chamber, wherein the at least one inlet allows gas to flow in, and wherein the convergence channel is disposed corresponding to the at least one inlet and guides the gas from the at least one inlet toward the convergence chamber defined by the central cavity; and
    a resonance plate disposed between the gas inlet plate and the suspension plate, and having a central aperture and a movable part, wherein the central aperture is aligned with the convergence chamber, and the movable part surrounds the central aperture,
    wherein a gap is formed between the resonance plate, the suspension plate, the bracket and the outer frame to define a first chamber, so that the gas from the at least one inlet of the gas inlet plate is converged to the central cavity through the at least one convergence channel and flows into the first chamber through the central aperture of the resonance plate when the piezoelectric actuator is enabled to bend the suspension plate to vibrate, whereby the gas is further transferred through a resonance effect between the suspension plate and the movable part of the resonance plate.

4. The actuating-type gas guiding device according to claim 3, wherein a first surface of the gas inlet plate is coated with a synthesized paint that is doped with graphene.

5. The actuating-type gas guiding device according to claim 3, wherein the suspension plate is a square suspension plate with a bulge.

6. The actuating-type gas guiding device according to claim 3, wherein the actuating-type gas guiding device further comprises a conducting plate, a first insulation plate and a second insulation plate, wherein the gas inlet plate, the resonance plate, the outer frame, the first insulation plate, the conducting plate and the second insulation plate are stacked sequentially.

7. The actuating-type gas guiding device according to claim 1, wherein the main body comprises one selected from the group consisting of an oven blower, a dental light curing machine, a range hood, a sweeper, a projector heat-dissipation device, an air blower, a dehumidifier, a vacuum cleaner, an air cleaner, a refrigerator, a micro refrigerator, a hair dryer, an air conditioner, a fan, a portable ice fan, a portable fan, a heat-dissipation seat cushion, an external heat dissipation module of the mobile phone, an external heat dissipation module of a notebook computer, a heat dissipation module of a lamp, a heat dissipation module of an engine and a power supply device.

8. The actuating-type gas guiding device according to claim 1, wherein the actuating-type gas guiding device further comprises a sensor disposed adjacent to the piezoelectric actuator, wherein when the piezoelectric actuator is enabled to guide the gas along the non-scattered linear direction, the gas is transferred through the sensor and sensed by the sensor, so that the sensor generates an output data, wherein the output data is transmitted to a connection device and displayed, stored and transmitted by the connection device.

9. An actuating-type gas guiding device, comprising:
at least one main body; and
at least one piezoelectric actuator disposed in the at least one main body, wherein the piezoelectric actuator comprises:
  at least one suspension plate, wherein the suspension plate has a first surface and a second surface, and the suspension plate is permitted to undergo a bending vibration;
  at least one outer frame arranged around the at least one suspension plate;
  at least one bracket connected between the at least one suspension plate and the at least one outer frame for elastically supporting the at least one suspension plate; and
  at least one piezoelectric element attached on the first surface of the suspension plate, wherein in response to a voltage applied to the piezoelectric element, the suspension plate is driven to undergo the bending vibration in a reciprocating manner, so that gas is guided to flow in the main body along a non-scattered linear direction, wherein the at least one piezoelectric element is made of at least one mixture comprising lead zirconate titanate piezoelectric powder and graphene, wherein a weight percentage of the graphene is in a range between 0.1% and 20%.

* * * * *